United States Patent
Rinderknecht et al.

(10) Patent No.: US 6,920,597 B2
(45) Date of Patent: Jul. 19, 2005

(54) UNIFORM TESTING OF TRISTATE NETS IN LOGIC BIST

(76) Inventors: Thomas Hans Rinderknecht, 8593 SW. Iroquois Dr., Tualatin, OR (US) 97062; Randy Klingenberg, 15585 SW. Burntwood Ct., Beaverton, OR (US) 97007; Nagesh Tamarapalli, 29290 SW. Parkway Ct., Wilsonville, OR (US) 97070

( * ) Notice: Subject to any disclaimer, the term of this patent is extended or adjusted under 35 U.S.C. 154(b) by 533 days.

(21) Appl. No.: 10/209,817

(22) Filed: Jul. 31, 2002

(65) Prior Publication Data

US 2004/0025096 A1 Feb. 5, 2004

(51) Int. Cl.⁷ .............................................. G01R 31/28
(52) U.S. Cl. ...................................... 714/733; 714/724
(58) Field of Search ........................... 714/733, 30, 724; 703/15, 14; 702/119

(56) References Cited

U.S. PATENT DOCUMENTS

| | | | | |
|---|---|---|---|---|
| 5,513,190 A | * | 4/1996 | Johnson et al. | 714/733 |
| 5,734,581 A | * | 3/1998 | Butts et al. | 703/15 |
| 5,774,473 A | * | 6/1998 | Harley | 714/30 |
| 5,949,990 A | * | 9/1999 | Mangelsdorf | 703/14 |
| 6,295,636 B1 | | 9/2001 | Dupenloup | |
| 6,493,648 B1 | * | 12/2002 | Anderson | 702/119 |

* cited by examiner

Primary Examiner—David Ton
(74) Attorney, Agent, or Firm—Klarquist Sparkman, LLP

(57) ABSTRACT

A built-in-self-test (BIST) circuit is discussed for selecting tristate nets with substantially uniform distribution using a tristate testing control device (TTCD). The circuit allows the deterministic testing of tristate nets in the context of pseudo-random BIST. A feedback shift register is described that activates a single tristate or set of tristate at a time in order to avoid bus contention. Another TTCD embodiment uses a counter and decoder. A test mode switching unit (TMSU) coupled between the TTCD and the tristate net selects test or functional mode for tristate enables. Parallel multiplexers are discussed as one embodiment of a TMSU. Another TMSU embodiment describes even better test coverage. A method, which may be performed on a distributed computer system, is discussed for identifying tristate nets within a net-list and adding a TTCD and a TMSU to the net-list.

31 Claims, 13 Drawing Sheets

UNIFORM TESTING OF TRISTATE NETS IN LOGIC BIST

TECHNICAL FIELD

This invention relates generally to testing integrated circuits using built-in-self-test (BIST) logic, and, more specifically, to testing tristate gates in a BIST environment.

BACKGROUND

As integrated circuits are produced with greater and greater levels of circuit density, efficient testing schemes that guarantee very high fault coverage while minimizing test costs and chip area overhead have become essential. However, as the complexity of circuits continues to increase, high fault coverage of several types of fault models becomes more difficult to achieve with traditional testing paradigms. This difficulty arises for several reasons. First, larger integrated circuits have a very high and still increasing logic-to-pin ratio that creates a test data transfer bottleneck at the chip pins. Second, larger circuits require a prohibitively large volume of test data that must be then stored in external testing equipment. Third, applying the test data to a large circuit requires an increasingly long test application time. And fourth, present external testing equipment is unable to test such larger circuits at their speed of operation.

Integrated circuits are presently tested using a number of structured design for testability (DFT) techniques. These techniques rest on the general concept of making all or some state variables (memory elements such as flip-flops and latches) directly controllable and observable. If this can be arranged, a circuit can be treated, as far as testing of combinational faults is concerned, as a combinational or a nearly combinational network. The most-often used DFT methodology is based on scan chains. It assumes that during testing all (or almost all) memory elements are connected into one or more shift registers, as shown in U.S. Pat. No. 4,503,537. A circuit that has been designed for test has two modes of operation: a functional mode and a test, or scan, mode. In the functional mode, the memory elements perform their regular functions. In the scan mode, the memory elements become scan cells that are connected to form a number of shift registers called scan chains. These scan chains are used to shift a set of test patterns into the circuit and to shift out circuit, or test, responses to the test patterns. The test responses are then compared to fault-free responses to determine if the circuit under test (CUT) works properly.

Scan design methodology has gained widespread adoption by virtue of its simple automatic test pattern generation (ATPG) and silicon debugging capabilities. Today, ATPG software tools are so efficient that it is possible to generate test sets (a collection of test patterns) that guarantee almost complete fault coverage of several types of fault models including stuck-at, transition, path delay faults, and bridging faults. Typically, when a particular potential fault in a circuit is targeted by an ATPG tool, only a small number of scan cells, e.g., 2–5%, must be specified to detect the particular fault (deterministically specified cells). The remaining scan cells in the scan chains are filled with random binary values (randomly specified cells). This way the pattern is fully specified, more likely to detect some additional faults, and can be stored on a tester.

FIG. 1 is a block diagram of a conventional system 10 for testing digital circuits with scan chains. External automatic testing equipment (ATE), or tester, 12 applies a set of fully specified test patterns 14 one by one to a CUT 16 in scan mode via scan chains 18 within the circuit. The circuit is then run in functional mode using the test pattern as input, and the test response to the test pattern is stored in the scan chains. With the circuit again in scan mode, the response is then routed to the tester 12, which compares the response with a fault-free reference response 20, also one by one. For large circuits, this approach becomes infeasible because of large test set sizes and long test application times. It has been reported that the volume of test data can exceed one kilobit per single logic gate in a large design. The significant limitation of this approach is that it requires an expensive, memory-intensive tester and a long test time to test a complex circuit.

These limitations of time and storage can be overcome to some extent by adopting a built-in self-test (BIST) framework as shown in FIG. 2. In BIST, additional on-chip circuitry is included to generate test patterns, evaluate test responses, and control the test. For example, a pseudo-random pattern generator 21 is used to generate the test patterns, instead of having deterministic test patterns. Additionally, a multiple input signature register (MISR) 22 is used to generate and store a resulting signature from test responses. In conventional logic BIST, where pseudo-random patterns are used as test patterns, 95–96% coverage of stuck-at faults can be achieved provided that test points are employed to address random-pattern resistant faults. On average, one to two test points may be required for every 1000 gates. In BIST, all responses propagating to observable outputs and the signature register have to be known. Unknown values corrupt the signature and therefore must be bounded by additional test logic. Even though pseudo-random test patterns appear to cover a significant percentage of stuck-at faults, these patterns must be supplemented by deterministic patterns that target the remaining, random pattern resistant faults. One example of where deterministic patterns are desirable is where multiple tristate gates may drive a bus on the circuit under test.

Tristate gates are often part of an integrated circuit that is tested by BIST. A tristate gate is a simple buffer with an enable signal such that it outputs one of three states: high, low, and floating. Some logic circuits have multiple tristate gates coupled to a common output net. These multiple tristate gates need to be managed so they do not cause contention by driving the net with conflicting values. In a first approach, a single tristate gate is enabled at a time so as to avoid bus contention. A second approach enables multiple tristate gates at the same time, where all the enabled tristate gates drive the net with the same value. Because some designers feel the second approach is undesirable, it will not be discussed further.

FIG. 3 illustrates a problem associated with testing tristate gates using scan flops containing pseudo-random values. Three such tristate gates, if simultaneously enabled, could create errors during BIST. In this case, three memory elements 316, 318, 320 in a scan chain, are coupled to the enable inputs 304, 306, 308, on three tristate gates, respectively, 322, 324, and 326. When the enable signal (e.g., 304, 306, . . . , 308) of a tristate gate is activated, the enabled tristate gate drives its input signal (e.g., 310, 312, . . . , 314, respectively) onto the bus 302. The resultant voltage is captured in flip-flop 328. If two tristate gates (e.g., 322, 324) are simultaneously activated, they both drive the bus, possibly, to conflicting voltage levels leaving an unknown resultant voltage captured in flip-flop 328. These unknown results are called X-sources, which are undesirable because the output value is indeterminate. If pseudo-random patterns are used to load the memory elements in the scan chains, there is a high likelihood that double driving of the bus 302 will occur during testing.

FIG. 4 is a prior art design that ensures only a single tristate gate drives the bus 302 at a time. This design 400 inserts logic gates (i.e., 402, 404, 406, 408) into the enable nets. These logic gates guarantee only a single tristate gate is activated at a given time. During logic BIST, the bist_mode signal 410 is activated thereby activating tristate gate 326, and deactivating the other tristate gates 322, 324. Since the bist_mode 410 feeds directly into the OR gate 408, one tristate enable 308 remains activated throughout BIST testing. However, this configuration does not test for a stuck-at-zero fault on each of the AND gates, since the AND gate outputs are never set. Thus, although bus contention is avoided using this method, many tristate gates remain untested.

FIG. 5 is another prior art design used to test tristate gates. The design 500 inserts logic gates into the enable nets of the BIST logic to ensure only one of tristate gates 322, 324, 326 is activated at a time. Although the approach of FIG. 5 provides better coverage than that of FIG. 4, it still suffers from poor fault coverage for any random set of values scanned into the scan flops (i.e., 316, 318, 320).

Using this approach 500, the first tristate gate 322 is enabled for approximately 50% of the random patterns (e.g., 1-0-0, 1-0-1, 1-1-0, and 1-1-1), the second gate 324 is enabled for 25% of the random patterns (e.g., 0-1-0 and 0-1-1), the third tristate gate 326 is enabled for 25% of the random patterns (e.g., 0-0-1 and 0-0-0). Specifically, the first tristate gate 322 is enabled whenever its corresponding scan flop 316 is activated. The second tristate gate 324 is enabled whenever its corresponding scan flop 318 is activated, so long as the first scan flop 316 is deactivated. The third tristate gate 326 is enabled, so long as both the first and second flops (i.e., 316, 318) are deactivated. Using this approach 500, a scan flop (e.g., 318) enables its corresponding tristate gate (e.g., 324), when the scan flop is activated, and all prior scan flops are deactivated (e.g., 0-1-1 and 0-1-1), and the last tristate gate in the series (e.g., 326) is enabled whenever the prior scan flops in the series are not activated (e.g., 0-0-1 and 0-0-0). As this circuit logic is extend to a greater number of tristate gates, there is a reduced likelihood that the last few tristate gates in the series will be enabled. Using this approach, some tristate gates may be tested many times, while others are rarely (or possibly never) tested.

Thus, there is still a need to provide a test circuit that adequately tests tristate gates in a BIST environment.

SUMMARY

The present invention provides a tristate testing control device (TTCD) that deterministically activates tristate enables in the context of pseudo-random BIST. The TTCD provides an output activation signal that activates a single tristate gate or single set of tristate gates so as to avoid bus contention during BIST. Additionally, the TTCD may provide a substantially uniform distribution of enables during logic BIST.

In one aspect, the TTCD is implemented as serially coupled memory elements that shift a single activated signal. A feedback loop may be added to the TTCD to provide plural enables to each set of tristate gates. Another TTCD embodiment is implemented as a counter coupled to decoder logic.

In another aspect, a test mode switching unit (TMSU) provides switching from functional logic tristate enable to BIST logic tristate enable for a tristate net.

These and other aspects and features of the invention are described below with reference to the accompanying drawings.

DETAILED DESCRIPTION

Figure 6:
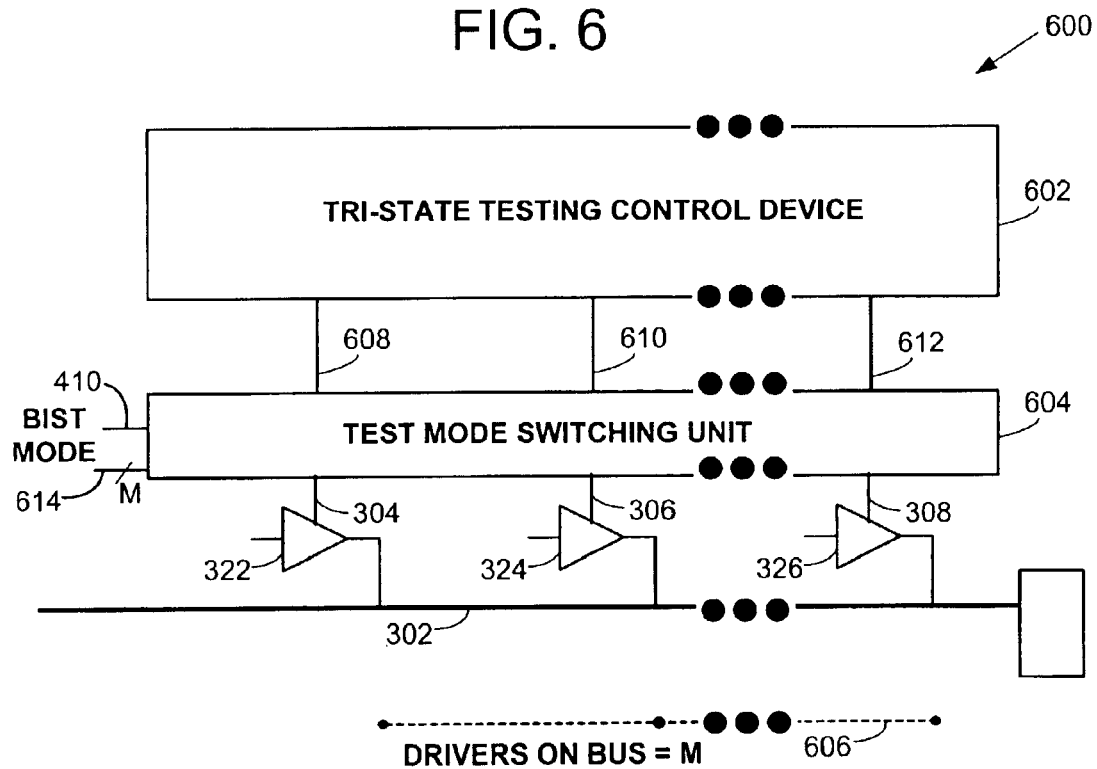
FIG. 6 is a block diagram of a tristate testing control device and a test mode switching device used to test tristate gates according to the invention.

With reference to FIG. 6, an illustrated embodiment 600 provides a substantially uniform distribution of fault coverage for tristate enables during logic BIST. A tristate testing control device 602 is used to test tristate gates in an integrated circuit. The tristate testing control device 602 outputs values during logic BIST, which are transferred through a test mode switching unit 604 to the tristate enables when the BIST test mode input 410 is activated. The tristate testing control device 602 contains logic that forces its outputs (e.g., 608, 610, ... 612) into deterministic patterns (e.g., 1-0-0, 0-1-0, ... 0-0 respectively) which are desirable inputs for the tristate gate enable inputs. Although only three tristate gates (322, 324, 326) are shown on a specific bus 302, the tristate testing control device 602, along with the test mode switching unit 604, are scalable to select a variable number (M) of drivers for an arbitrary bus 606, where M ranges from 2 to any desired number of drivers. Notably, only a single tristate gate coupled to a common bus is enabled at a time. For example, when M=4, the tristate testing control device may output the following test patterns, 1-0-0-0, 0-1-0-0, 0-0-1-0, and 0-0-0-1; or when M=5, the tristate testing control device 602 may output the following test patterns, 1-0-0-0-0, 0-1-0-0-0, 0-0-1-0-0, 0-0-0-1-0, and 0-0-0-0-1, etc. The test mode switching unit 604, is configured to pass the same signals (M) through to the tristate enables when bist_mode 410 is enabled (e.g., 608 is passed through to 304, 610 is passed through to 306, etc.). When bist_mode is not enabled, the test mode switching unit 604 passes functional mode enable inputs 614 to the tristate enables.

Figure 1:
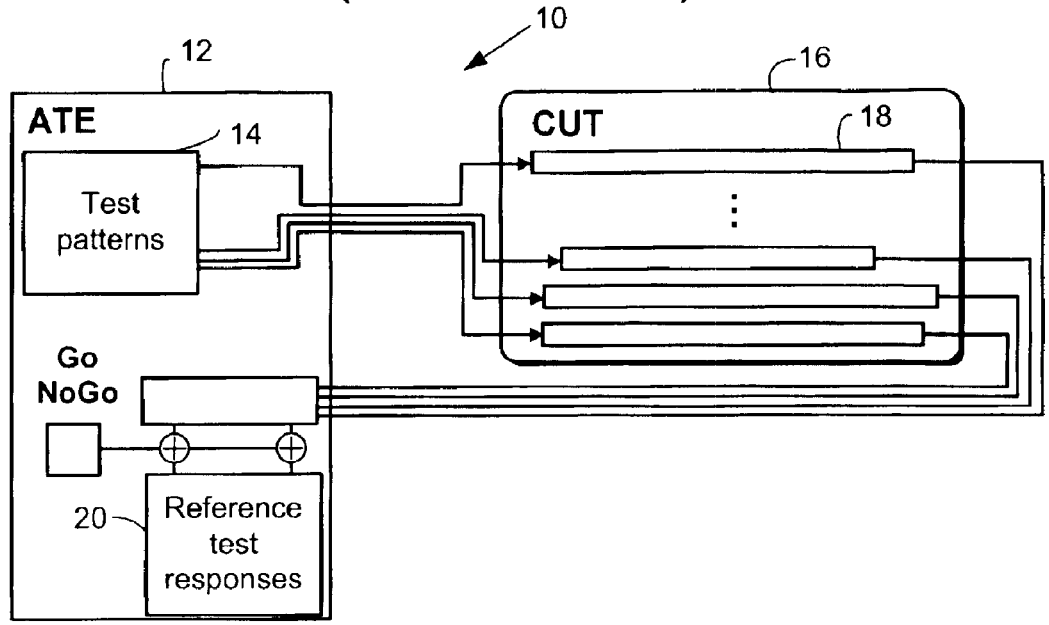
FIG. 1 is a block diagram of a prior art system for testing integrated circuits.
Figure 2:
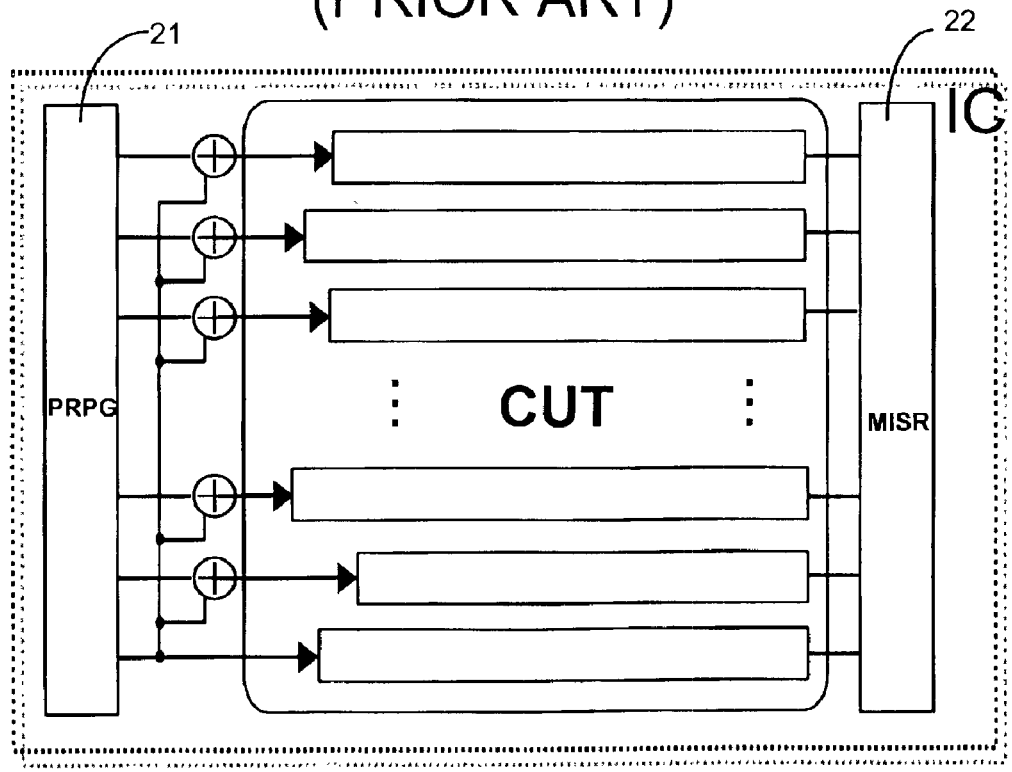
FIG. 2 is a block diagram of a prior art system using a built-in-self-test system.
Figure 3:
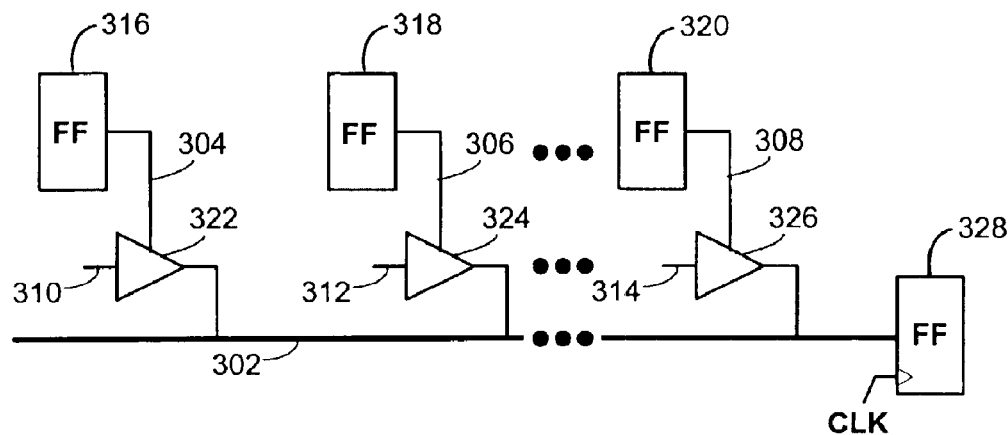
FIG. 3 is a circuit diagram that illustrates how pseudo random values create bus contention on a prior art tristate net.
Figure 4:
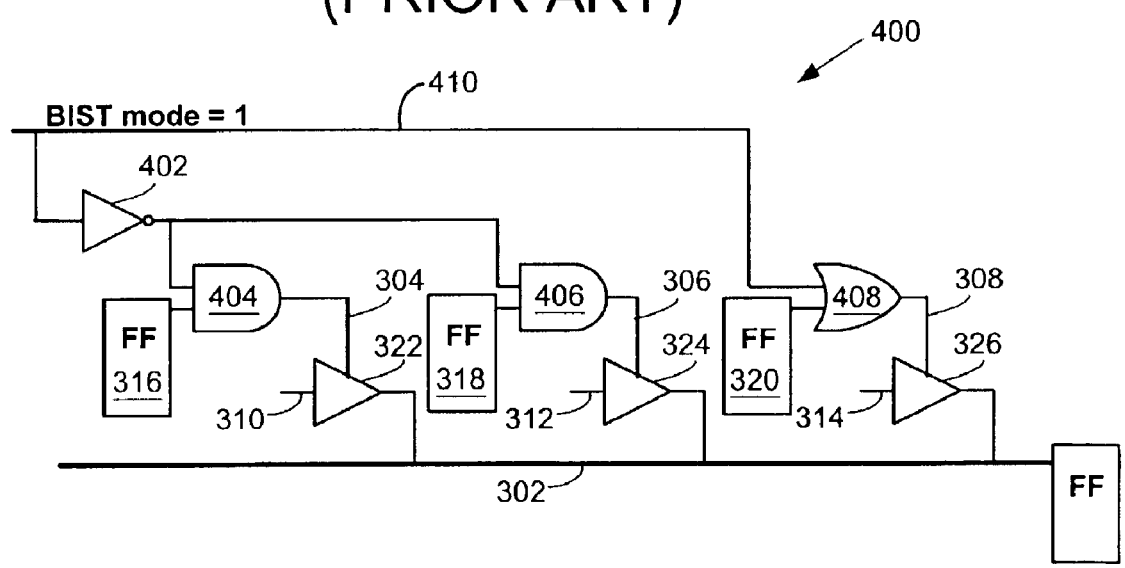
FIG. 4 is a circuit diagram of a prior art design for testing tristate gates.
Figure 5:
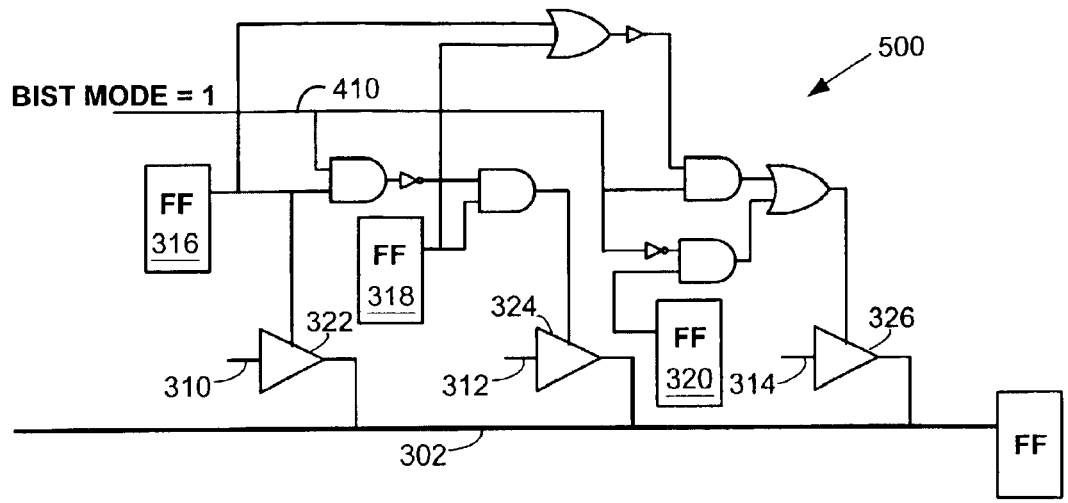
FIG. 5 is still another circuit diagram of a prior art design for testing tristate gates.

Over a series of BIST tests, the tristate testing control device 602 is configurable to perform a substantially uniform distribution of enables across tristate enables. In the prior art, tristate enables could be forced into a valid configuration (i.e., FIG. 5, 500), but the probability of fault coverage for all tristate enables decreased as the number of tristates in contention increased. With the illustrated embodiment tristate enables may be tested deterministically with a set of test patterns greater than or equal to the number of tristate gates (e.g., 2 tristate gates, 0-1 and 1-0; 3 gates 0-0-1, 0-1-0, and 1-0-0; etc.)

In this application, a substantially uniform distribution of testing enables means that each tristate gate in valid contention with other tristates for bus access is tested, and if multiple tests are performed on each tristate enable, they are performed roughly in proportion. Of course this includes perfect uniform distribution, but also includes distribution in which the tristate enables are tested within a few enables of each other.

Figure 7:
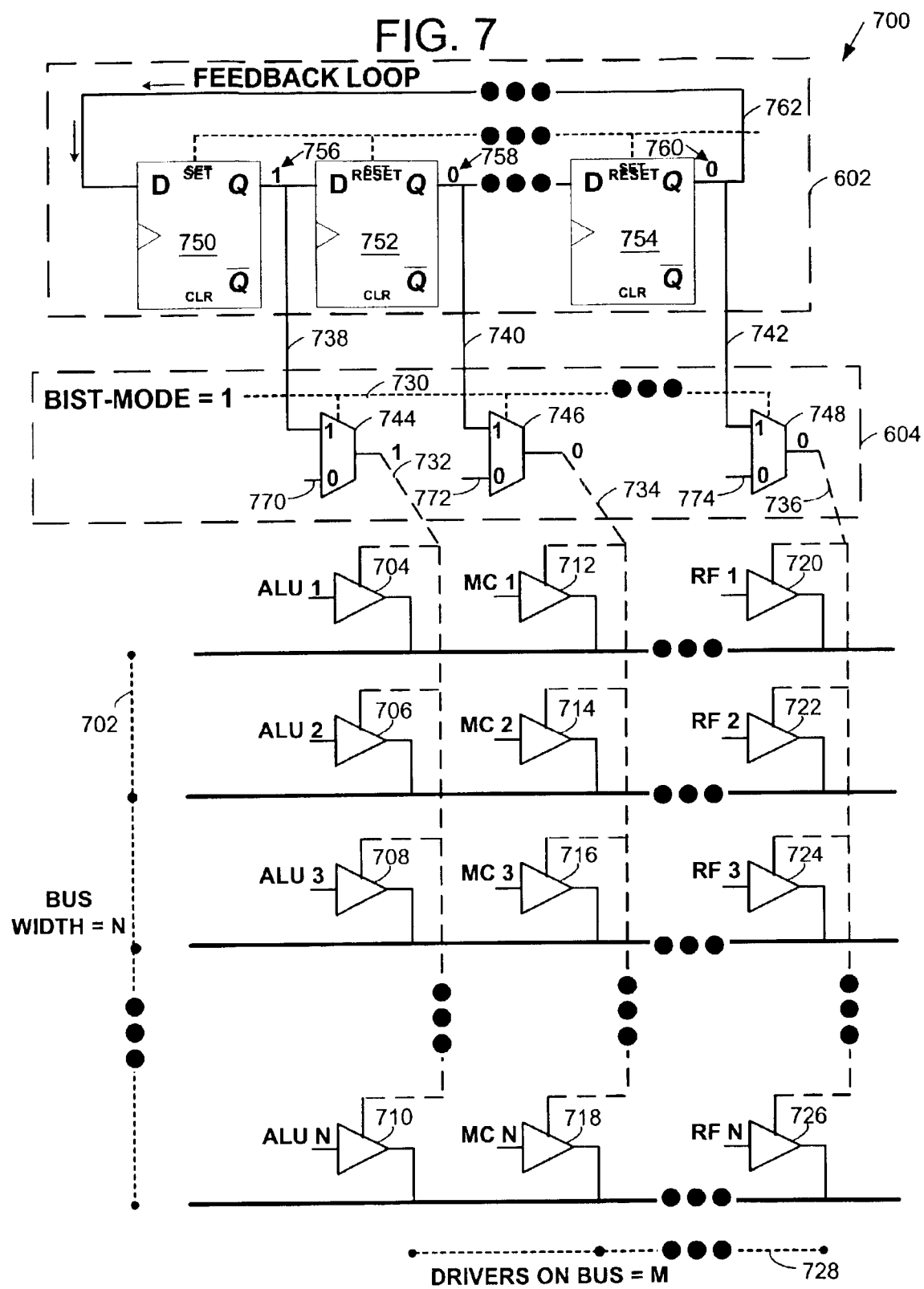
FIG. 7 is a circuit diagram showing one embodiment of the tristate testing control device of FIG. 6 as a feedback shift register and the test mode switching unit of FIG. 6 as a set of multiplexers.

With reference to FIG. 7, an illustrated embodiment 700 is discussed in the context of an N-bit bus 702, with M sets of drivers 728 (wherein a set includes any number of drivers: 1, 2, 3 . . . ). The N-bit bus has M sets of tristate enables, each set when enabled drives the bus (e.g., set 1=704, 706, 708, . . . , 710; set 2=712, 714, 716, . . . , 718; and set 3=720, 722, 724, . . . , 712). In this case, three sets of tristate gates (M=3) drive the bus. For example, an N-bit ALU (not shown) drives the bus (i.e., ALU-1, ALU-2, ALU-3, . . . ALU-N), when its corresponding set of tristate gates (i.e., set 1) are enabled. Similarly, an N-bit memory controller (not shown) drives the bus (i.e., MC-1, MC-2, MC-3, . . . MC-N), when its corresponding set of tristate gates (i.e., set 2) are enabled. Finally, an N-bit register file (not shown) drives the bus (i.e., RF-1, RF-2, RF-3, . . . RF-N), when its corresponding set of tristate gates (i.e., set 3) are enabled to drive the bus. A bus or net can be a single conductor (N=1) or multiple parallel conductors (N=4) 702 as shown in FIG. 7. Thus the number of lines on the bus (N) 702 can range from 1 to many lines. The number of drivers on the bus (M) 728 can range from 2 to many drivers.

In FIG. 7, the test mode switching unit 604, is implemented as a series of multiplexers, one multiplexer 744, 746, . . . , 748, for each output 738, 740, . . . , 742, from the tristate testing control device 602. With a bist_mode signal 730 activated, the series of multiplexers in the test mode switching unit 604 select the tristate testing control device outputs 738, 740, . . . , 742, to control the enables of the sets of tristate gates 732, 734, . . . , 736. In functional mode, the sets of tristate gates are controlled with functional mode enable inputs 770, 772, . . . , 774. The test mode switching unit 604, can be readily varied in size by adding or subtracting multiplexers to equal the number of sets of tristate gates in the net.

In this example, the tristate enables are tied together in sets and enabled with a single multiplexer (e.g., set 1 is enabled simultaneously with a common enable signal 732 from multiplexer 744; set 2 is enabled with 734, etc). However, in another embodiment, a multiplexer could be used for each tristate gate in the set (e.g., one for 704, one for 706, . . . , one for 710, etc.). In such a case, the tristate testing control output for the set of tristate gates (e.g., 738) is run to the single multiplexer coupled to each tristate in the set.

In FIG. 7, an illustrated embodiment of the tristate testing control device 602 is implemented as serially coupled memory elements 750, 752, . . . , 754, equal to the number of sets of tristate gates (i.e., M=3 in this case). In this case, the memory elements are shown as D flip-flops, but other memory elements known in the art may be used. As shown in this embodiment, during a BIST clock period, the first memory element has an activated output as shown at 756, and the other memory elements have a deactivated output as shown at 758, 760. Thus, only one set of tristate gates is enabled (i.e., set 1) at a time. In the next BIST clock period, the activated output is shifted into the second memory element 752. In the third BIST clock period, the activated output is shifted into the third memory element 754. In this way each set of tristate gates are selected to be enabled (i.e., set 1, set 2, set 3) as the activated output is shifted through the memory element outputs (i.e., 738, 740, 742, respectively). In another embodiment, if it is desirable to test sets of tristate gates more than once, a feedback loop 762 is employed to start activation at the first memory element once the activated bit is shifted out of the last memory element. The tristate testing control device 602, can be readily varied in size by adding or subtracting memory elements equal to the number of sets of tristate gates in the net. This approached can be altered to function in logic high or low.

Another advantage of this approach is at-speed performance. The single activated memory element shifts during the first shift cycle. Thus there is little concern over routing delays on the connection between the activated memory element and the multiplexer. The impact on the functional mode timing is limited to the transport delay of the enable signal through the multiplexer. This approach also works properly in the presence of multiple clock pulses during the capture cycle, since the tristate testing control device remains at a steady state.

Figure 8:
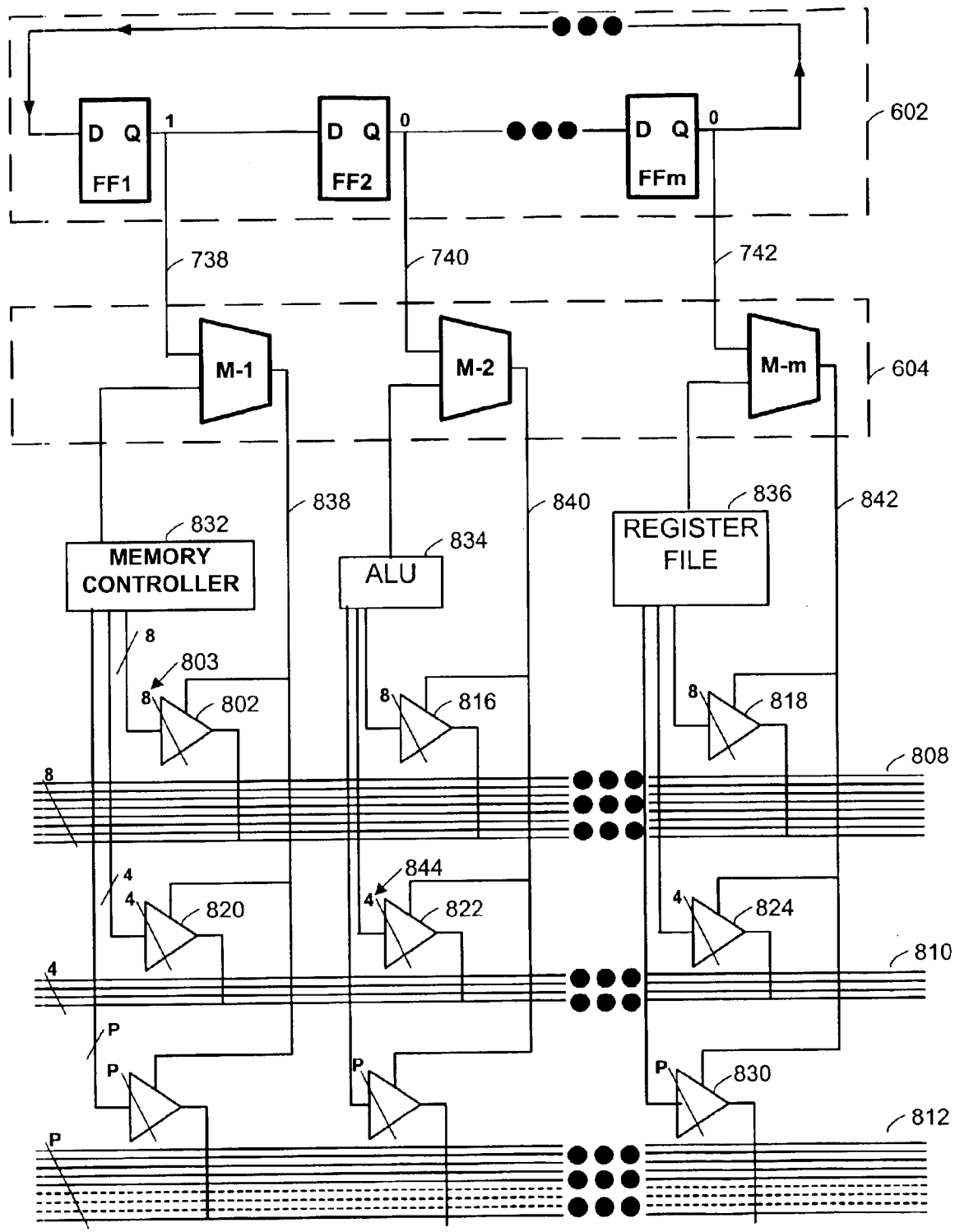
FIG. 8 is a circuit diagram showing a feedback shift register to test plural tristate nets.

In FIG. 8, an illustrated embodiment shows how a single tristate testing control device 602 is used to control the enables on three buses 808, 810, 812. A first bus 808 has eight parallel conductors. The first bus has three component sources (i.e., three sub-blocks): a memory controller 832, an ALU 834, and a register file 836. Many types of sources can drive a bus, so the three sources shown are merely representative. In this example, each of the three sources 832, 834, 836, on the eight bit bus 808, drives 8 bits onto the bus 802, 816, . . . , 818, whenever the signal for the respective driver is enabled 838, 840, 842. To save space on the drawing, the set of eight tristate gates for this 8-bit bus are represented as a single tristate gate with a slash and the number eight as shown at 803.

There is also a 4-bit bus 810 shown in the illustrated embodiment. In this example, the four bit bus 810 has the same sources 832, 834, 836, as the eight bit bus 808. As before, each of these drivers 820, 822, 824, drive data onto the four bit bus 810, whenever the signal for the respective driver is enabled 838, 840, 842. Again, each set of tristate gates is represented with a slash and the number four, as shown at 844.

Finally, any number of additional buses (e.g., P-Bit bus) 812, can be controlled with the same tristate testing control device 602, when the number of memory elements in the tristate testing control device 602 is equal to the number of drivers on the bus. For example, given a circuit (not shown) described in the following Table 1, three tristate testing control devices are required to test the tristate gates on eight buses. Bus 1 and 2 are tested with a tristate testing control devices containing 52 memory elements, one memory element to select each driver on the bus. Bus 3 and 4 are tested with a tristate testing control device containing 6 memory elements, and bus 5, 6, and 7 are tested with a tristate testing control device containing 2 memory elements.

TABLE 1

| Identified Buses | Bus Width (# Conductors) | Number of Drivers on Bus |
|---|---|---|
| Bus 1 | 1 bit | 52 |
| Bus 2 | 32 bits | 52 |
| Bus 3 | 32 bits | 6 |
| Bus 4 | 16 bits | 6 |
| Bus 5 | 64 bits | 2 |
| Bus 6 | 128 bits | 2 |
| Bus 7 | 3 bits | 2 |

In FIG. 8, a single test mode switching unit 604 is used to select tristate enable sets 838, 840, 842 for multiple buses. In another embodiment, each bus 808, 810, 812 could have a separate test mode switching unit 604, and the tristate testing control device 602 outputs 738, 740, 742, would run to each of said separate test mode switching devices.

Figure 9:
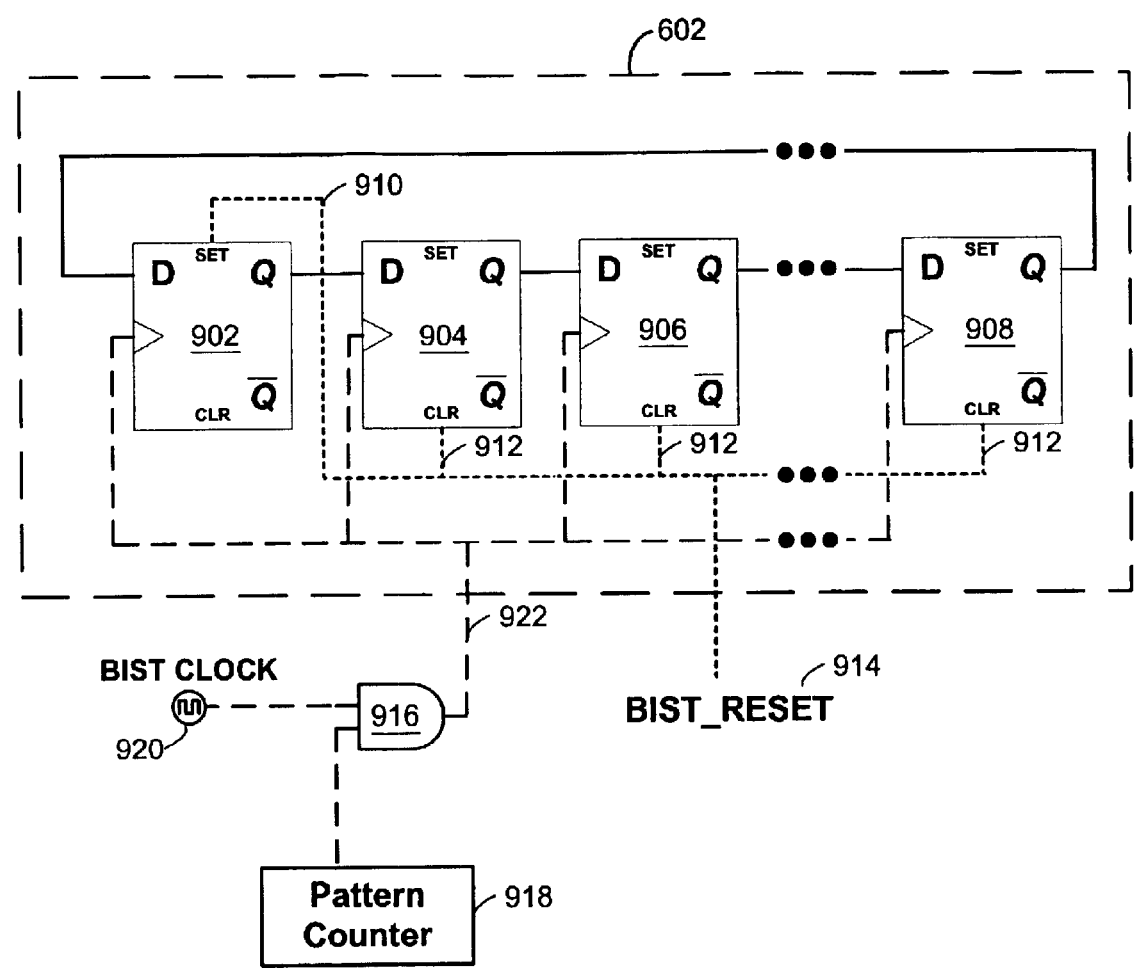
FIG. 9 is a circuit diagram showing reset logic for the tristate testing control device of FIG. 7.

In FIG. 9, a tristate testing control device 602 is loaded with a start state at the beginning of each test. In this case the memory elements are asynchronous set-reset memory elements 902, 904, 906, 908, resulting in the start state of 1-0-0, . . . -0. The first memory element "set pin" 910 is activated, whereas, all other memory elements have their "reset pins" 912 activated during BIST reset 914. At the start of the test, the pattern counter 918 is initialized, and the BIST reset is set to the start state 914. The BIST clock 920 is the clock that drives the pattern down the scan chains (not shown). However, the bits in the memory elements 902, 904, 906, . . . , 908, are shifted once per pattern. So the bits are shifted only when both the pattern counter 918 is enabled, and the BIST clock 920 is enabled. In such a case the AND gate 916 is activated thereby causing the bit shift signal 922 to shift the activated bit through the memory elements 902, 904, 906, . . . , 908, in a serial fashion.

Figure 10:
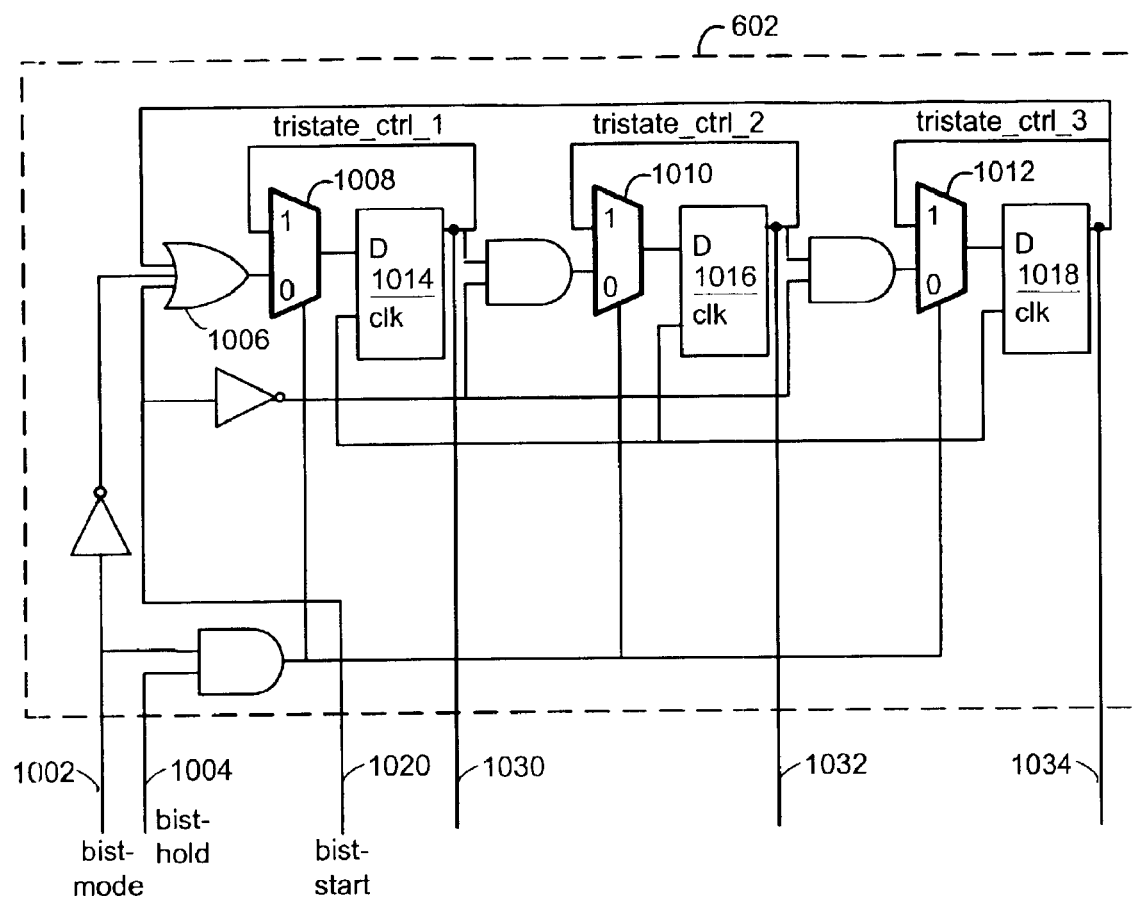
FIG. 10 is another embodiment of the tristate testing control device of FIG. 6.
Figure 11:
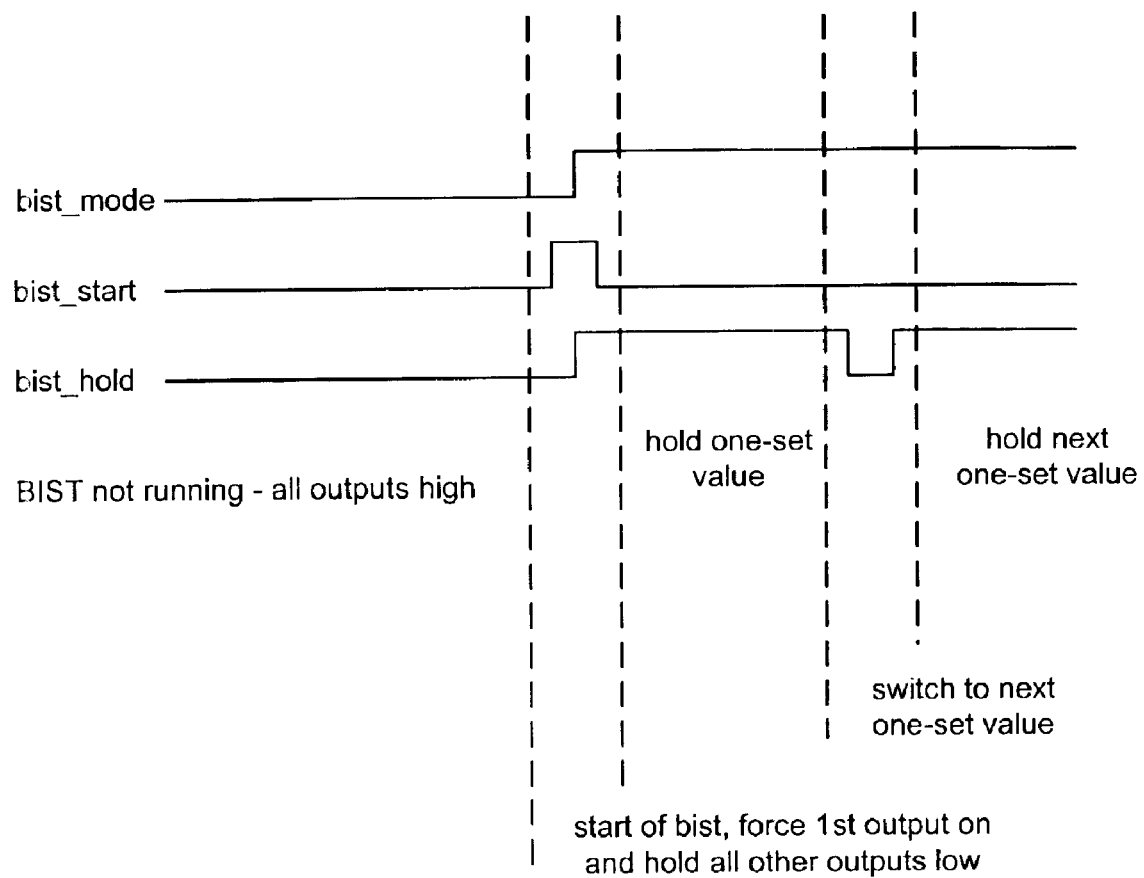
FIG. 11 is a timing diagram for the feedback shift register depicted in FIG. 10.
Figure 12:
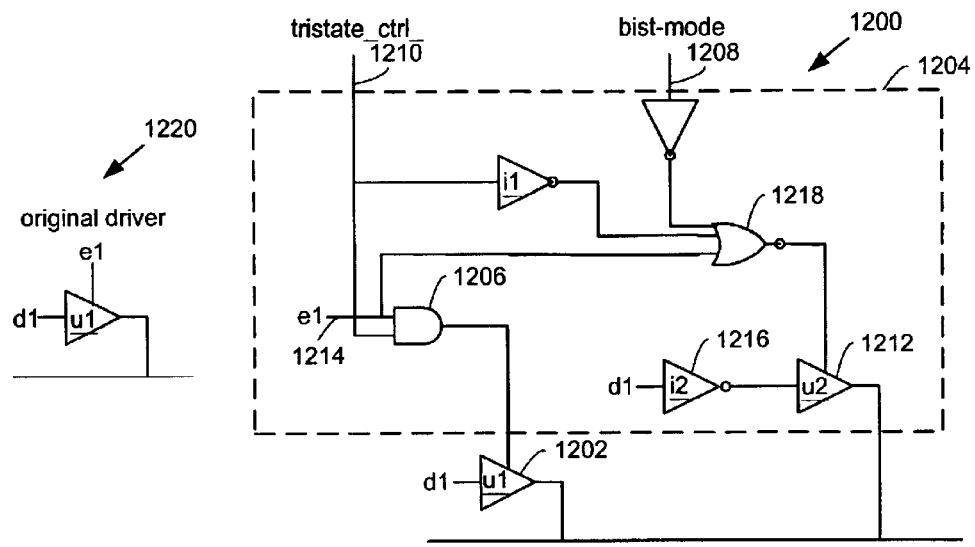
FIG. 12 is a circuit diagram of an alternative element of a test mode switching unit with increased fault coverage.

FIG. 10, 11, and 12 depict additional features to the embodiments discussed in FIGS. 7, 8 and 9. The previous embodiments (i.e., FIGS. 7, 8, and 9) describe circuits for testing stuck-at faults in tristate nets. However, the transition faults in the enable signals are not visible, since the enable retains a static value during the application of each logic BIST pattern.

In FIG. 10, an illustrated embodiment drives a single memory element output signal high during the application of each logic BIST pattern, but also adds the feature that all outputs are driven high while in functional mode. To achieve functional mode, the bist_mode signal 1002 is reset, and the bist_hold signal 1004 is reset, thereby setting the OR-gate 1006 output. This outputs shifts into the remaining memory elements 1014, 1016, . . . , 1018. Thus, all memory element outputs are set within three clock cycles. These memory element outputs put the tristate enables (not shown) into functional mode.

However, for test mode, at the start of the BIST test, the bist_mode signal 1002 goes high, and the bist_start signal 1020 is pulsed. The bist_start pulse forces the output from the $1^{st}$ flip-flop to "1", and the output of all of the remaining flip-flops to "0". This places the tristate test control device 602 in the start BIST start state (i.e., 1-0-0). To shift the activated memory element (i.e., 0-1-0), the bist_hold signal 1004 is employed. The bist_hold signal is normally set to "1", and drops to a "0" for a single cycle during the process of applying a new logic BIST pattern into the core.

The memory element outputs 1030, 1032, 1034, activate the tristate enables (not shown). As long as the tristate bus value is captured into at least one memory element in the core, most faults within the this circuit are observable during logic BIST. In another embodiment, memory elements (e.g., flip-flops) with asynchronous set/reset input are used in the tristate test control device, and a bist_reset signal initializes all the memory elements with a "1" for functional mode.

FIG. 11 is a timing diagram showing the signal timing pattern discussed in the description of FIG. 10.

FIG. 12 is an illustrated embodiment 1200 of a circuit 1204 that replaces the multiplexers (e.g., 744) shown in FIG. 7. As before, this circuit 1204 can be placed in parallel (one for each enable signal exiting the tristate testing control device) to create a test mode switching unit with added fault coverage. This embodiment 1200 helps reduce untested faults. An AND-gate 1206 is added into the path feeding each original driver 1202, and a second tristate driver 1212 is added into the circuit for each original tristate gate 1202. During functional mode, when the bist_mode signal 1208 is deactivated, and the enable signal 1210 is set (as discussed for FIG. 10, in functional mode), the original enable signal (e1) 1214 passes through the two input AND-gate 1206 and the tristate bus operates in functional mode.

During logic BIST testing, the bist_mode signal is set, and the tristate testing control device (e.g., FIG. 10, 602) operates such that only a single enable signal is set for each pattern. While in bist_mode, and when this specific enable signal 1210 is reset, neither the original tristate driver (u1) 1202, nor the test mode driver (u2) 1212 are active. While in bist_mode, when this specific enable signal 1210 is set, the bus is driven by either the original driver 1202, or the test mode driver 1212 depending on the state of the functional mode enable input (e1) 1214. Unlike the multiplexer scenario (e.g., 744, FIG. 7), here the functional mode enable signal 1214 is testable. With sufficient patterns, all faults within the test logic are observed at the bus, except for a stuck-at-1 fault on the bist_mode signal 1208.

This circuitry is advantageous because it introduces only a single untested fault for each tristate driver, and it also provides a method for monitoring the at-speed operation of the enable signal. Multiple clock pulses during the capture window may cause the enable to change state (i.e., from one tristate 1202, to the other 1212). When this happens, the inverter (i2) 1216 inverts the data on the bus. This change in bus state is observed in the output scan thereby signaling that both tristates (i.e., 1202, 1212) successfully drove the bus. It also shows that the functional mode enable logic (i.e. 1214) is functioning to drive the bus. Thus, the illustrated embodiment 1200 allows greater fault coverage than the multiplexer embodiment.

In yet another embodiment (not shown), the inverter (i2) 1216 is replaced with a direct connection to ground or vcc (forcing the tristate input into a constant 0, or 1). This embodiment allows observability of at-speed changes of the enable signal, but not observability of (d1) for all patterns where (e1) 1214 is not set. Notably, a single AND-gate 1206 is added to the functional path thus minimizing the impact on timing. Further, the second tristate driver (u2) 1212 is located very close to the original 1202, thereby minimizing timing dependencies. Finally, the path that activates the test (u2) 1212 only adds a three-input nor gate 1218 to the original enable signal (e1) 1214, thereby minimizing timing dependencies.

Figure 13:
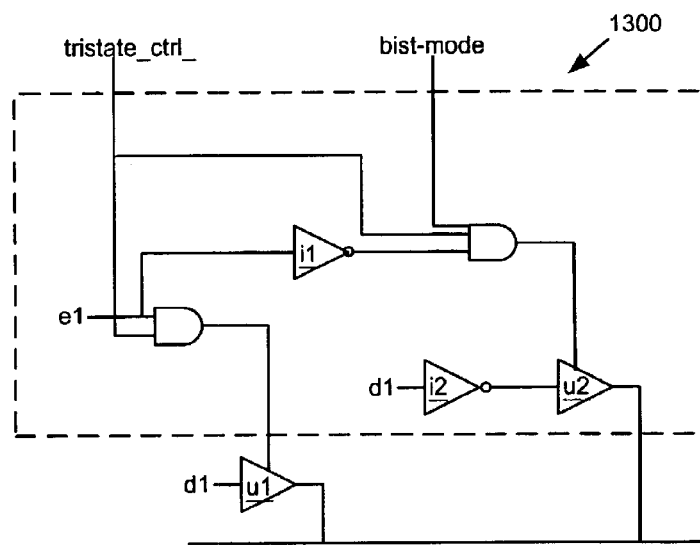
FIG. 13 is a circuit diagram of an alternative element of a test mode switching unit.

The substantially uniform distribution of enables are defined in "pairs" in the context of the circuits described in FIGS. 12 and 13. Specifically, in FIG. 12, each original tristate gate 1220 is replaced by a pair of tristate gates (i.e., 1202 and 1212). In BIST mode, when the tristate control 1210 is enabled, the "pair" of tristate gates are selected. In this sense, the tristate testing control device selects pairs of tristate gates uniformly. However, tristate gates within a pair need not be selected uniformly in order to be within this definition of substantially uniform distribution. Switching between the original driver (u1) and the added test mode driver (u2), depends on the original enable input signal. Thus, the probability of using u1 versus u2 is circuit specific.

FIG. 13 represents another embodiment of the logic discussed in FIG. 12. Both FIG. 12 and FIG. 13, alone or in parallel, are alternative embodiments of a test mode switching unit 604.

Figure 14:
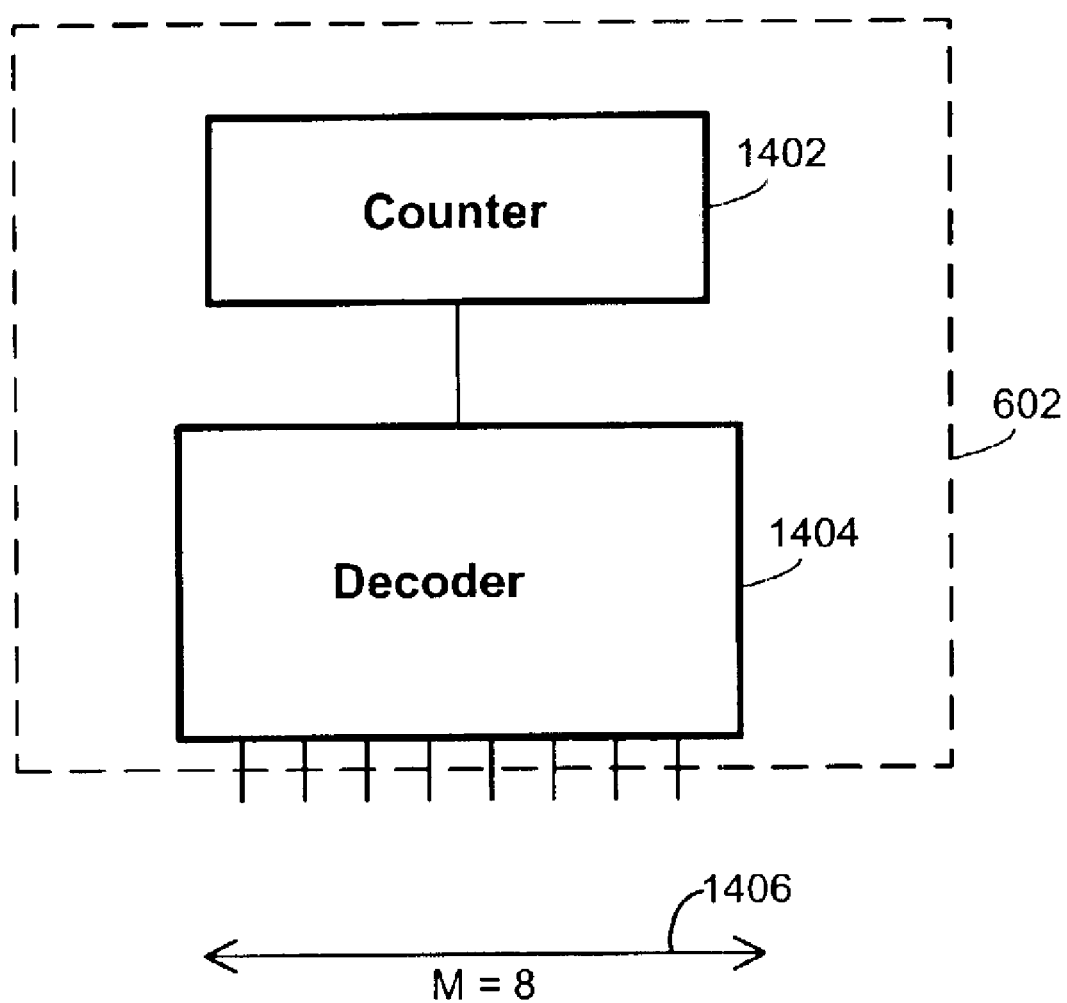
FIG. 14 is a circuit diagram of another embodiment of the tristate testing control device of FIG. 6.

FIG. 14 represents yet another embodiment for the tristate testing control device 602. In this embodiment, a counter 1402 counts from 0 to M (in the illustrated example 0–7), and a decoder 1404 decodes the counter output to select a single set of tristate enables for each counter value. As the counter counts from 0 to 7, the decoder logic 1404, selects consecutively a set of tristate enables 1406 to drive onto the bus.

Figure 15:
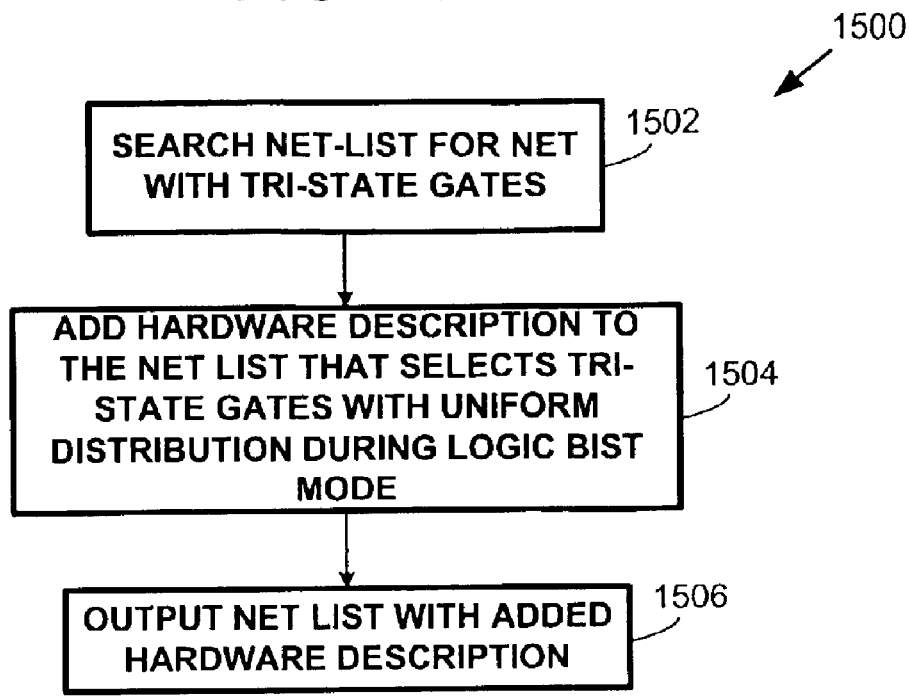
FIG. 15 is a flowchart of a method of processing tristate nets for enable control.

FIG. 15 is an illustrated embodiment of a method employed in a tool used to design logic BIST. A net-list is a list of hardware components. The net-list is developed during the design of an integrated circuit, and is a hardware description used to convert the design into an integrated circuit. For example, a net-list can be the output of a behavioral synthesis tool. In this embodiment, in a software tool used to design logic BIST, a method is added 1500, that searches the net-list 1502 for tristate gates. Once tristate gates are located in the net list, the method adds a description of hardware 1504 to the net list. This description added to the net-list, includes a description of a tristate testing control device 602, a test mode switching unit 604, and/or other hardware described herein. The method then outputs the modified net-list 1506. The integrated circuit design and manufacturing cycle remains otherwise the same, and the resulting manufactured integrated circuit contains the logic BIST modified as discussed herein. In another embodiment, this method 1500 is implemented as a software tool separate from a net-list design tool.

Figure 16:
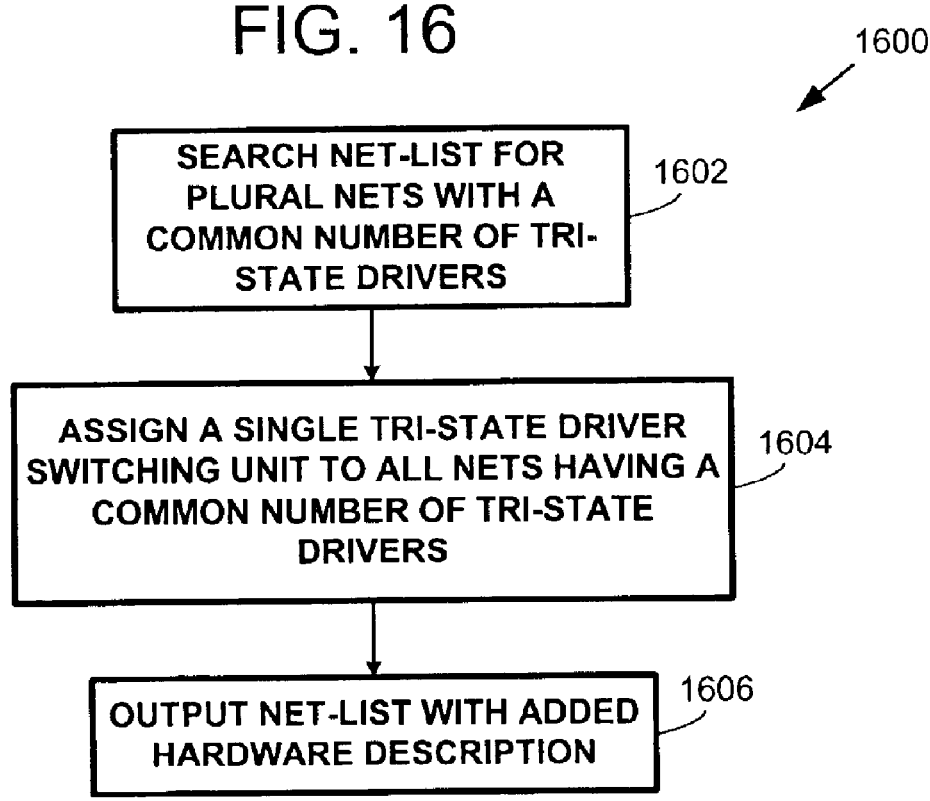
FIG. 16 is a flowchart of a method of processing plural tristate nets for enable control.

FIG. 16 is an illustrated embodiment of a method employed in a tool used to design logic BIST. In this embodiment, a tool used to design logic BIST has a method added 1600, that searches the net-list 1602 for nets with tristate gates that have a common number of sets of drivers on the net 1602. Once nets with a common number of sets of drivers are located in the net list, the method adds a description of hardware 1604 to the net-list. This description added to the net-list, includes a description of a tristate testing control device 602, a test mode switching unit 604, and/or other hardware described herein. The added description tests the tristate nets with a common number of sets of drivers, using the same tristate testing control device. The method then outputs the modified net-list 1606. The integrated circuit design and manufacturing cycle remains otherwise the same, and the resulting manufactured integrated circuit contains the logic BIST as modified herein.

Figure 17:
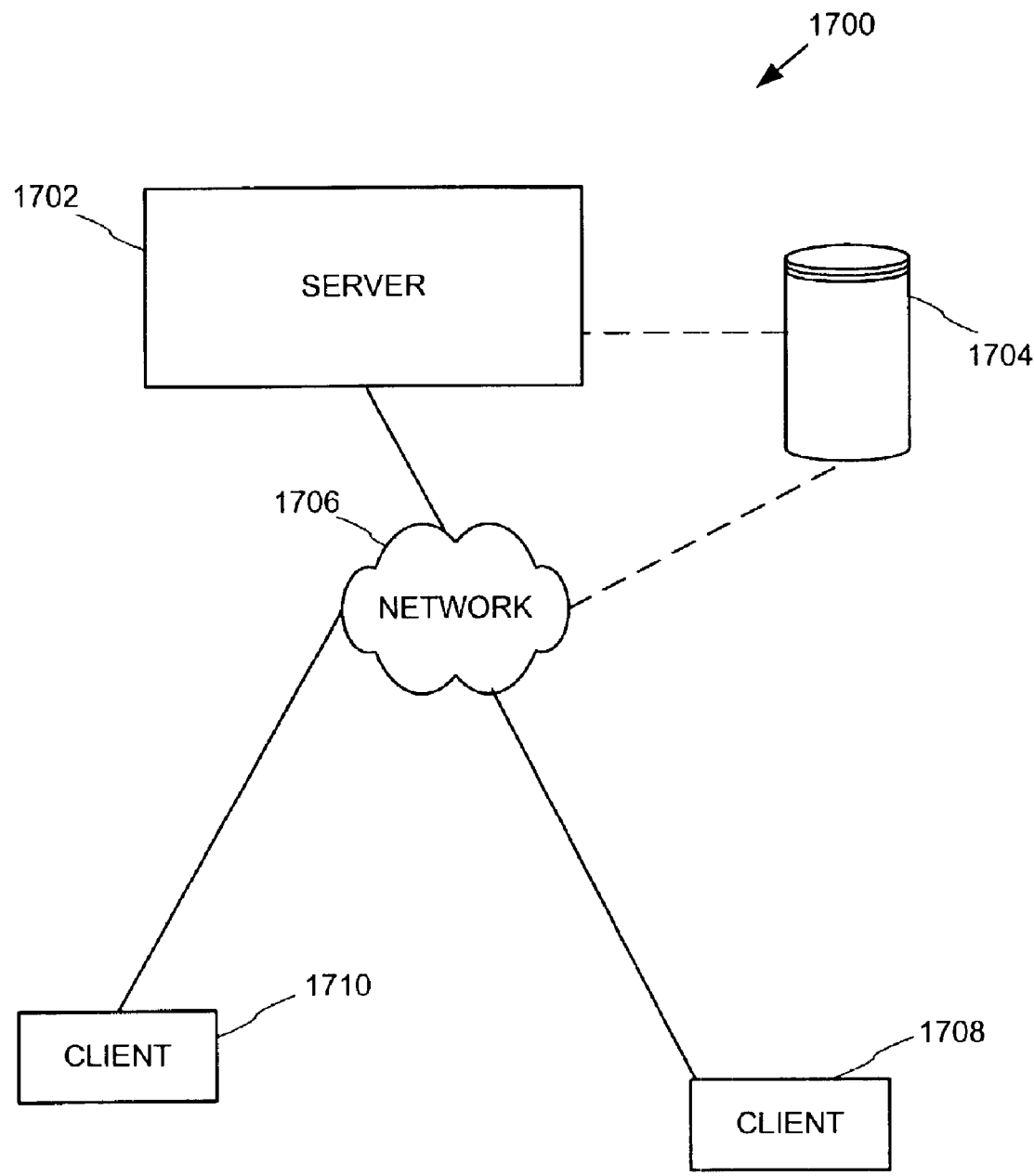
FIG. 17 is a network model for a distributed method of processing tristate nets for enable control.

FIG. 17 shows that portions of the described methods (e.g., FIGS. 15 and 16) may be applied to a distributed network 1700. For example, a server computer 1702 and or a client computer may have an associated database 1704 (internal or external to the server/client computer). The server computer 1702 may be coupled to a network shown generally at 1706. One or more client computers, such as those shown at 1710 and 1708, may be coupled to the network to interface with the server computer using a network protocol.

Figure 18:
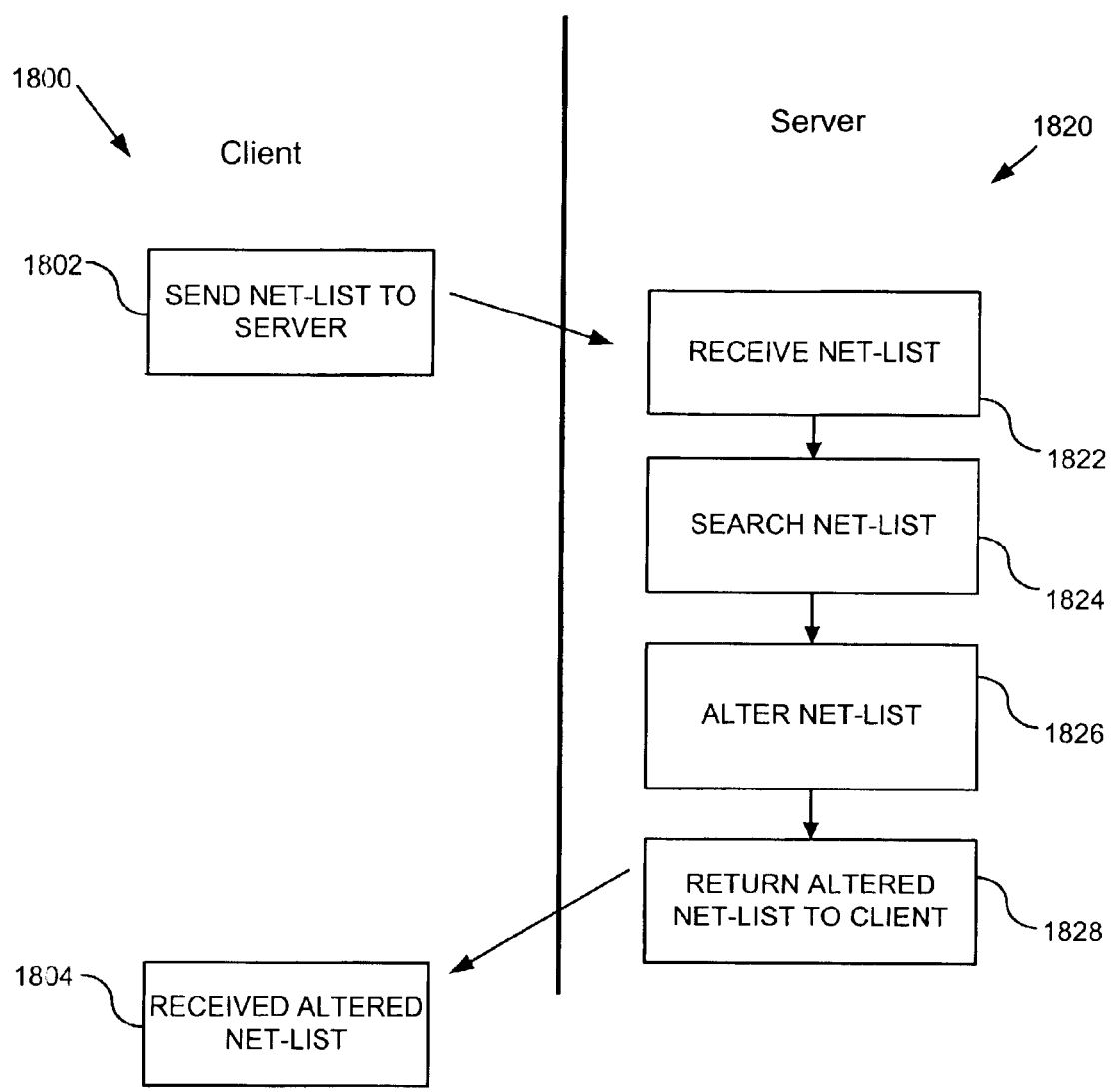
FIG. 18 is a flowchart of a distributed method of processing tristate nets for enable control.

FIG. 18 shows that the described design methods (e.g., FIGS. 15 and 16) may be accomplished in part by a remote server computer 1820, such as server computer 1702 in FIG. 17. In process block 1802, the client computer 1800 sends a net-list to the server computer 1820. In process block 1822, the net-list is received by the server computer. In process block 1824, the net-list is searched for tristate nets. In process block 1826, a tristate testing control device, a test mode switching unit and/or other hardware described herein are added to the net-list. In process block 1828, the server computer then returns the altered net-list to the client computer 1828. In process block 1824, the client computer receives the altered net-list.

It should be noted that one or more of the foregoing process blocks may be carried out by the server instead of the client and vice versa. The particular division between the client and server is not of importance.

In view of the many possible embodiments, it will be recognized that the illustrated embodiments include only examples of the invention and should not be taken as a limitation on the scope of the invention. Rather, the invention is defined by the following claims. We therefore claim as the invention all such embodiments that come within the scope of these claims.

We claim:

1. A method of testing tristate gates in an integrated circuit, comprising:
   loading a shift register with a predetermined value;
   coupling the shift register to enable inputs of a plurality of tristate gates, the tristate gates having outputs coupled to a common output conductor; and
   shifting the shift register to activate one of the tristate gates at a time.

2. The method of claim 1, wherein the activated output from the shift register activates a set of tristate gates, each member of the set coupled to a separate conductor.

3. The method of claim 1, wherein after each of the enable inputs of the plurality of tristate gates are activated, consecutively activating in order again, each of the enable inputs.

4. The method of claim 1, wherein the shift register includes multiple memory elements coupled in series and wherein loading the shift register includes setting one of the memory elements and resetting the remaining memory elements.

5. The method of claim 4, wherein during functional mode, the outputs of the memory elements are set.

6. The method of claim 4, wherein upon activation of a common shift signal feeding into each of the multiple memory elements, the output of each memory element is read into the input of an adjacent one of the memory elements, and the output of the last memory element is read into the input of the first memory element.

7. The method of claim 6, wherein the common shift signal is generated by an AND gate receiving as inputs, a bist clock signal and a pattern counter signal.

8. The method of claim 1, wherein the tristate gates are tested with substantially uniform distribution.

9. The method of claim 1, further comprising:
selecting test mode on a test mode switching unit coupled between the shift register and the plurality of tristate gates.

10. The method of claim 9, wherein the test mode switching unit includes a series of multiplexers, one multiplexer for each tristate gate enable input.

11. The method of claim 9, wherein the test mode switching unit includes a series of multiplexers and wherein an enable output from each multiplexer is coupled to a set of tristate gate enable inputs.

12. The method of claim 9, wherein the test mode switching unit includes a series of logic circuits, wherein each logic circuit when activated by the shift register, selects an original tristate gate enable when the original tristate gate functional mode enable input is activated, and selects a test tristate gate enable when the original tristate gate functional mode enable input is deactivated.

13. The method of claim 9, wherein each test mode switching unit tristate enable output is coupled to two or more sets of tristate enables, each said set, coupled to a different bus.

14. A circuit for testing of tristate gates in a built-in-self-test environment, comprising:
a plurality of tristate gates coupled to a common conductor, each tristate having an input terminal, an output terminal coupled to the common conductor, and an enable terminal, the enable terminal, when activated, driving the output terminal to match data on the input terminal, and, when deactivated, not driving the output terminal; and
a tristate testing control device coupled to the enable terminals of the plurality of tristate gates, the tristate testing control device ensuring that only one of the tristate gates drives the conductor at a time and that tests the tristate gates with uniform distribution.

15. The circuit of claim 14, further including a test mode switching unit coupled between the tristate testing control device and the plurality of tristate gates that couples the tristate testing control device to the enable terminals in a test mode of operation and that decouples the tristate testing control device from the enable terminals in a functional mode of operation.

16. The circuit of claim 15, wherein the test mode switching unit is implemented as parallel multiplexers, one multiplexer for each tristate gate.

17. The circuit of claim 14, wherein the tristate testing control device includes serially coupled memory elements that shift an activated bit through the memory elements to ensure that only one tristate gate drives the conductor at a time.

18. The circuit of claim 14, wherein the tristate testing control device includes a counter and a decoder.

19. A circuit for testing of tristate gates in a built-in-self-test environment, comprising:
a shift register having multiple memory elements coupled in series and multiple outputs from the memory elements;
a plurality of tristate gates coupled to a common conductor, each tristate having an input terminal, an output terminal coupled to the common conductor, and an enable terminal; and
wherein the multiple outputs from the memory elements of the shift register are coupled to the enable terminals of the tristate gates.

20. The circuit of claim 19, wherein each output from the memory elements is coupled to the control terminals of a set of tristate gates driving a set of parallel conductors of a bus.

21. The circuit of claim 20, wherein a test mode switching device is coupled between the multiple outputs from the memory element, and the set of tristate gates driving the set of parallel conductors of the bus.

22. In a net-list describing a circuit with built-in-self-test circuitry, a method comprising:
identifying in the net-list, a tristate net with two or more sources that pass signals through the tristate net during a clock cycle if tristate gates associated with the sources are enabled during the clock cycle; and
altering the net-list to include built-in-self-test logic for enabling with substantially uniform distribution, tristate gates associated with the sources.

23. The method of claim 22, wherein the provided built-in-self-test logic for enabling tristate gates includes a feedback shift register.

24. The method of claim 22, wherein the provided built-in-self-test logic for enabling tristate gates includes a counter and a decoder.

25. An integrated circuit comprising the built-in-self-test logic of claim 22.

26. The method of claim 22, performed by a server computer wherein the server computer receives the net-list from a network connection, and returns the altered net-list to the network connection.

27. A computer-readable medium having computer-executable code for performing the method of claim 22.

28. In a design tool used to design built-in-self-test logic for testing an integrated circuit, comprising:
a means for identifying buses having tristate gates; and
a means for generating a net-list which includes hardware description to select the enables on the tristate gates of the identified buses with substantially uniform distribution.

29. The design tool of claim 28, further comprising:
a means for grouping identified buses based on the number of sources;
wherein the net-list description uses the same hardware to select the enables of the tristate gates on grouped buses.

30. In a networked computing environment, a method comprising:
sending a net-list modification request over a network connection; and
receiving in response to the request, a description of built-in-self-test logic for the substantially uniform distribution of tristate enables including a tristate testing control device.

31. An integrated circuit comprising the built-in-self-test logic received in claim 30.

* * * * *